United States Patent
Wang et al.

(10) Patent No.: US 11,538,886 B2
(45) Date of Patent: Dec. 27, 2022

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Lanlan Wang, Wuhan (CN); Yan Xie, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 230 days.

(21) Appl. No.: 16/637,776

(22) PCT Filed: Jan. 9, 2020

(86) PCT No.: PCT/CN2020/071052
§ 371 (c)(1),
(2) Date: Feb. 10, 2020

(87) PCT Pub. No.: WO2021/056930
PCT Pub. Date: Apr. 1, 2021

(65) Prior Publication Data
US 2021/0408199 A1    Dec. 30, 2021

(30) Foreign Application Priority Data
Sep. 27, 2019   (CN) .......................... 201910920977.8

(51) Int. Cl.
*H01L 27/32* (2006.01)
*H01L 51/00* (2006.01)

(52) U.S. Cl.
CPC ...... *H01L 27/3276* (2013.01); *H01L 27/3225* (2013.01); *H01L 51/0097* (2013.01)

(58) Field of Classification Search
CPC ............. H01L 27/3225; H01L 27/3227; H01L 27/3276
See application file for complete search history.

(56) References Cited

U.S. PATENT DOCUMENTS 9,356,087 B1   5/2016 Lee et al.
10,462,903 B2 * 10/2019 Sim ...................... H04M 1/026
(Continued)

FOREIGN PATENT DOCUMENTS

| CN | 105979696 A | 9/2016 |
| CN | 107004617 A | 8/2017 |

(Continued)

*Primary Examiner* — David Vu
*Assistant Examiner* — Brandon C Fox
(74) *Attorney, Agent, or Firm* — PV IP PC; Wei Te Chung; Ude Lu

(57) ABSTRACT

The present disclosure provides a display panel and a display device. A through-hole is defined in a bending area of the display panel, and after the bending area is bent along a bending center line, the through-hole forms a light transmitting area, and the light transmitting area is disposed on a light path of an electronic component. Based on the light transmitting area formed after bending the through-hole, the electronic component can be disposed under the display panel, thereby achieving a narrow frame design.

18 Claims, 5 Drawing Sheets

(56) References Cited

U.S. PATENT DOCUMENTS

| | | |
|---|---|---|
| 2016/0240605 A1 | 8/2016 | Lee et al. |
| 2016/0270234 A1* | 9/2016 | Ahn .................... H05K 1/0296 |
| 2017/0242457 A1* | 8/2017 | Lee ...................... G06F 3/0412 |
| 2018/0090698 A1* | 3/2018 | Jeong ................. H01L 51/0097 |
| 2018/0233552 A1 | 8/2018 | Lee et al. |
| 2019/0182960 A1 | 6/2019 | Ahn |
| 2019/0266379 A1 | 8/2019 | Huang et al. |
| 2019/0280054 A1 | 9/2019 | Huang et al. |
| 2021/0225989 A1* | 7/2021 | Ryu .................... H01L 51/5284 |
| 2021/0311365 A1* | 10/2021 | Aoki ................ G02F 1/136286 |

FOREIGN PATENT DOCUMENTS

| | | |
|---|---|---|
| CN | 107863000 A | 3/2018 |
| CN | 109426774 A | 3/2019 |
| CN | 109801949 A | 5/2019 |

\* cited by examiner

DISPLAY PANEL AND DISPLAY DEVICE

CROSS REFERENCE TO RELATED APPLICATIONS

The present application claims priority of the Chinese patent application numbered CN201910920977.8, filed on Sep. 27, 2019 with the National Intellectual Property Administration, titled "Display panel and display device", which is incorporated by reference in the present application in its entirety.

FIELD OF INVENTION

The present disclosure relates to the field of display technologies, and more particularly, to a display panel and a display device.

BACKGROUND OF INVENTION

With development of terminal display technology, requirements for narrow frames of display devices, such as mobile phones, are getting higher. Therefore, a way of independently disposing an electronic component, such as a camera, in a frame can no longer meet needs of users.

In order to achieve the requirements for narrow frames, current technology performs free-form cutting on display panels to obtain special-shaped screens, such as a notch screen or a water drop screen, and then disposes electronic components in a special-shaped area. However, this narrow frame technique requires cutting a display area of a display panel to form the special-shaped area. Such process is complicated, and the cutting area cannot emit light.

That is, current narrow frame technique has a technical problem that a display area of a display panel needs to be cut.

Technical problem: the present disclosure provides a display panel and a display device to solve the technical problem that current narrow frame technique needs to cut a display area of a display panel.

SUMMARY OF INVENTION

To solve the above problem, the present disclosure provides following technical solutions:

an embodiment of the present disclosure provides a display panel which comprises:

a transistor array substrate including a plurality of array-distributed transistors, wherein the transistor array substrate is divided into a display area, a bending area, and a driving area;

a light-emitting functional layer disposed in the display area of the transistor array substrate;

a driving component disposed in the driving area of the transistor array substrate; and a plurality of wirings disposed in the bending area of the transistor array substrate and electrically connected to the transistors and the driving component;

wherein a through-hole is defined in the bending area, and after the bending area is bent along a bending center line, the through-hole forms a light transmitting area, and the light transmitting area is disposed on a light path of an electronic component.

In the display panel provided by an embodiment of the present disclosure, wherein the through-hole comprises a first sub-through-hole area and a second sub-through-hole area, and the first sub-through-hole area and the second sub-through-hole area are symmetric about the bending center line.

In the display panel provided by an embodiment of the present disclosure, wherein a shape of the first sub-through-hole area is fan-shaped.

In the display panel provided by an embodiment of the present disclosure, wherein a shape of the first sub-through-hole area is rectangular.

In the display panel provided by an embodiment of the present disclosure, wherein a shape of the first sub-through-hole area is trapezoidal.

In the display panel provided by an embodiment of the present disclosure, wherein the through-hole comprises a first sub-through-hole and a second sub-through-hole, and the first sub-through-hole and the second sub-through-hole are symmetric about the bending center line.

In the display panel provided by an embodiment of the present disclosure, wherein a shape of the first sub-through-hole is circular.

In the display panel provided by an embodiment of the present disclosure, wherein a shape of the first sub-through-hole is rectangular.

In the display panel provided by an embodiment of the present disclosure, wherein a shape of the first sub-through-hole is regular polygonal.

In the display panel provided by an embodiment of the present disclosure, wherein in the bending area, the display panel comprises:

a flexible substrate layer;

a circuit layer patterned to form the wirings;

a first organic layer, wherein the circuit layer is disposed on the flexible substrate layer, and the first organic layer is disposed on the circuit layer; and a plurality of first protruding parts arranged on an upper surface of the first organic layer.

An embodiment of the present disclosure further provides a display device which comprises:

a display panel, comprising: a transistor array substrate including a plurality of array-distributed transistors, wherein the transistor array substrate is divided into a display area, a bending area, and a driving area; a light-emitting functional layer disposed in the display area of the transistor array substrate; a driving component disposed in the driving area of the transistor array substrate; and a plurality of wirings disposed in the bending area of the transistor array substrate and electrically connected to the transistors and the driving component; wherein a through-hole is defined in the bending area; and an electronic component is disposed under the display panel;

wherein a bonding area of the display panel is bent under the display area through the bending area, the through-hole in the bending area forms a light transmitting area, and the light transmitting area is disposed on a light path of the electronic component.

In the display device provided by an embodiment of the present disclosure, wherein the through-hole comprises a first sub-through-hole area and a second sub-through-hole area, and the first sub-through-hole area and the second sub-through-hole area are symmetric about the bending center line.

In the display device provided by an embodiment of the present disclosure, wherein a shape of the first sub-through-hole area is fan-shaped.

In the display device provided by an embodiment of the present disclosure, wherein a shape of the first sub-through-hole area is rectangular.

In the display device provided by an embodiment of the present disclosure, wherein a shape of the first sub-through-hole area is trapezoidal.

In the display device provided by an embodiment of the present disclosure, wherein the through-hole comprises a first sub-through-hole and a second sub-through-hole, and the first sub-through-hole and the second sub-through-hole are symmetric about the bending center line.

In the display device provided by an embodiment of the present disclosure, wherein a shape of the first sub-through-hole is circular.

In the display device provided by an embodiment of the present disclosure, wherein a shape of the first sub-through-hole is rectangular.

In the display device provided by an embodiment of the present disclosure, wherein a shape of the first sub-through-hole is regular polygonal.

In the display device provided by an embodiment of the present disclosure, wherein in the bending area, the display panel comprises:

a flexible substrate layer;

a circuit layer patterned to form the wirings;

a first organic layer, wherein the circuit layer is disposed on the flexible substrate layer, and the first organic layer is disposed on the circuit layer; and a plurality of first protruding parts arranged on an upper surface of the first organic layer.

Beneficial effect: the present disclosure provides a display panel and a display device. The display panel comprises a transistor array substrate divided into a display area, a bending area, and a driving area; a light-emitting functional layer disposed in the display area of the transistor array substrate; a driving component disposed in the driving area of the transistor array substrate; and a plurality of wirings disposed in the bending area of the transistor array substrate and electrically connected to transistors and the driving component. Wherein, a through-hole is defined in the bending area, after the bending area is bent along a bending center line, the through-hole forms a light transmitting area, and the light transmitting area is disposed on a light path of an electronic component. Based on the light transmitting area formed after bending the through-hole, the electronic component can be disposed under the display panel, which reduces a frame width without cutting the display area of the display panel to form a special-shaped area, thereby achieving a narrow frame design and solving the technical problem that current narrow frame technique needs to cut the display area of the display panel.

DETAILED DESCRIPTION OF PREFERRED EMBODIMENTS

Figure 1:
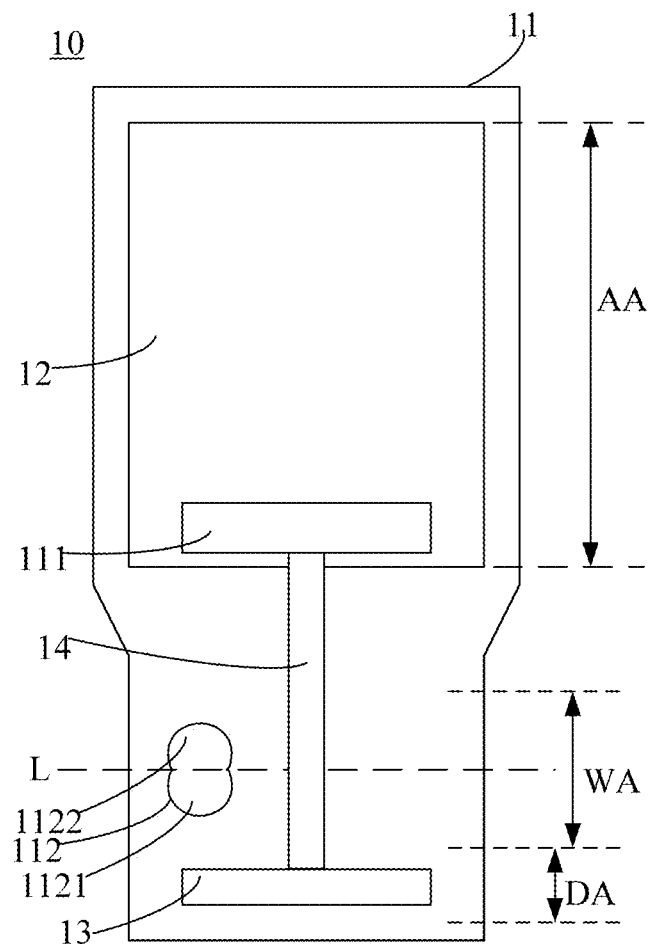
FIG. 1 is a first schematic structural diagram of a display panel according to an embodiment of the present disclosure.

The present disclosure provides a display panel and a display device. In order to make the purpose, technical solutions, and effects of this disclosure clearer and more definite, the following further describes this disclosure in detail with reference to the drawings and embodiments. It should be understood that the specific embodiments described herein are only used to explain the disclosure, and are not used to limit the disclosure.

An embodiment of the present disclosure can solve the technical problem that current narrow frame technique needs to cut a display area of a display panel.

As shown from FIG. 1 to FIG. 6, an embodiment of the present disclosure provides a display panel 10. The display panel 10 comprises:

a transistor array substrate 11 which includes a plurality of array-distributed transistors 111, and the transistor array substrate 11 is divided into a display area AA, a bending area WA, and a driving area DA;

a light-emitting functional layer 12 disposed in the display area AA of the transistor array substrate 11;

a driving component 13 disposed in the driving area DA of the transistor array substrate 11; and a plurality of wirings 14 disposed in the bending area WA of the transistor array substrate 11 and electrically connected to the plurality of transistors and the driving component 13.

Wherein, a through-hole 112 is defined in the bending area WA, and after the bending area WA is bent along a bending center line L, the through-hole 112 forms a light transmitting area TA, and the light transmitting area TA is disposed on a light path of an electronic component 3.

An embodiment of the present disclosure provides a display panel. The display panel comprises a transistor array substrate divided into a display area, a bending area, and a driving area; a light-emitting functional layer disposed in the display area of the transistor array substrate; a driving component disposed in the driving area of the transistor array substrate; and a plurality of wirings disposed in the bending area of the transistor array substrate and electrically connected to transistors and the driving component. Wherein, a through-hole is defined in the bending area, after the bending area is bent along a bending center line, the through-hole forms a light transmitting area, and the light transmitting area is disposed on a light path of an electronic component. Based on the light transmitting area formed after bending the through-hole, the electronic component can be disposed under the display panel, which reduces a frame width without cutting the display area of the display panel to form a special-shaped area, thereby achieving a narrow frame design.

In an embodiment of the present disclosure, the electronic component 3 may be a camera, an optical sensor, etc., and a number thereof may be one or more than one. When the number of the electronic component is more than one, each electronic component can independently correspond to a light transmitting area, which requires a plurality of through-holes 112 to be defined in the bending area WA; they can also share a light transmitting area, which requires just one through-hole 112 to be defined in the bending area WA. The embodiment of the present disclosure only uses defining one through-hole 112 in the bending area WA as an example for description. A method of defining the plurality of through-holes 112 in the bending area WA is similar to this.

In an embodiment of the present disclosure, the display panel can comprise at least one bending area WA, and each bending area WA has a bending center line L.

In an embodiment of the present disclosure, as shown in FIG. 1, wherein the through-hole 112 comprises a first sub-through-hole area 1121 and a second sub-through-hole area 1122, and the first sub-through-hole area 1121 and the second sub-through-hole area 1122 are symmetric about the bending center line L.

In an embodiment of the present disclosure, as shown in FIG. 1, a shape of the first sub-through-hole area is fan-shaped.

In an embodiment of the present disclosure, an arc angle of the fan shape may be greater than 180 degrees or less than 180 degrees, and can be set according to a size of an electronic component.

In an embodiment of the present disclosure, the arc angle of the fan shape is equal to 180 degrees, and at this time, the through-hole 112 is circular.

In an embodiment of the present disclosure, the arc angle of the fan shape is equal to 360 degrees, and at this time, the through-hole 112 is a figure-8 shape formed by two circles which are externally tangent.

In an embodiment of the present disclosure, a shape of the first sub-through-hole area is rectangular.

In an embodiment of the present disclosure, three sides of the rectangular shape may be same or different.

In an embodiment of the present disclosure, the shape of the first sub-through-hole area is trapezoidal.

In an embodiment of the present disclosure, three sides of the trapezoidal shape may be same or different.

In an embodiment of the present disclosure, the three sides of the trapezoidal shape are the same, and two top angles are both 120 degrees. At this time, the through-hole 112 is a regular hexagonal shape.

Figure 2:
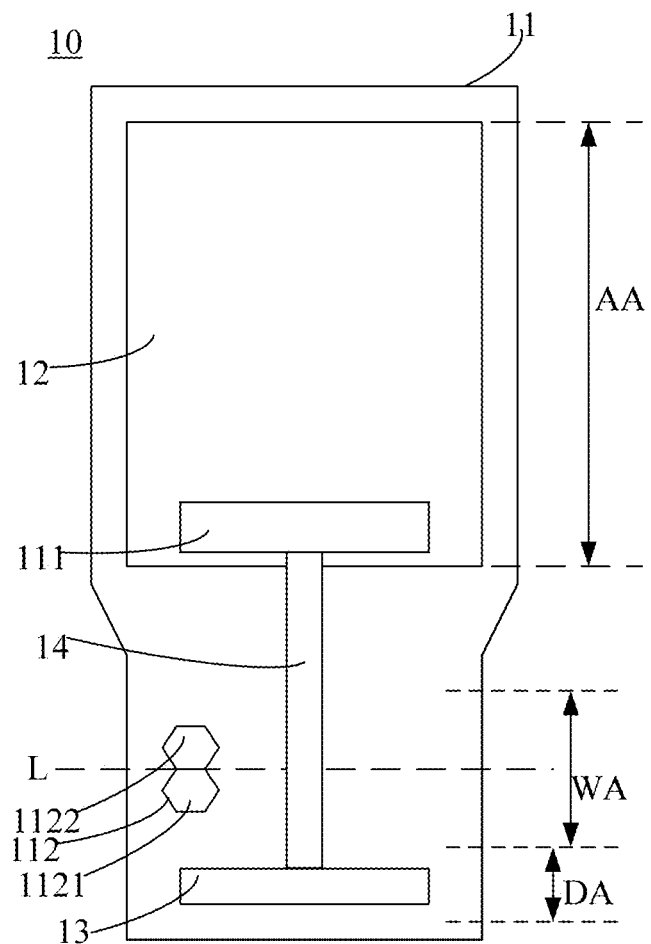
FIG. 2 is a second schematic structural diagram of a display panel according to an embodiment of the present disclosure.

In an embodiment of the present disclosure, as shown in FIG. 2, the shape of the first sub-through-hole area is regular hexagonal.

In an embodiment of the present disclosure, the shape of the first sub-through-hole area is regular polygonal.

Figure 3:
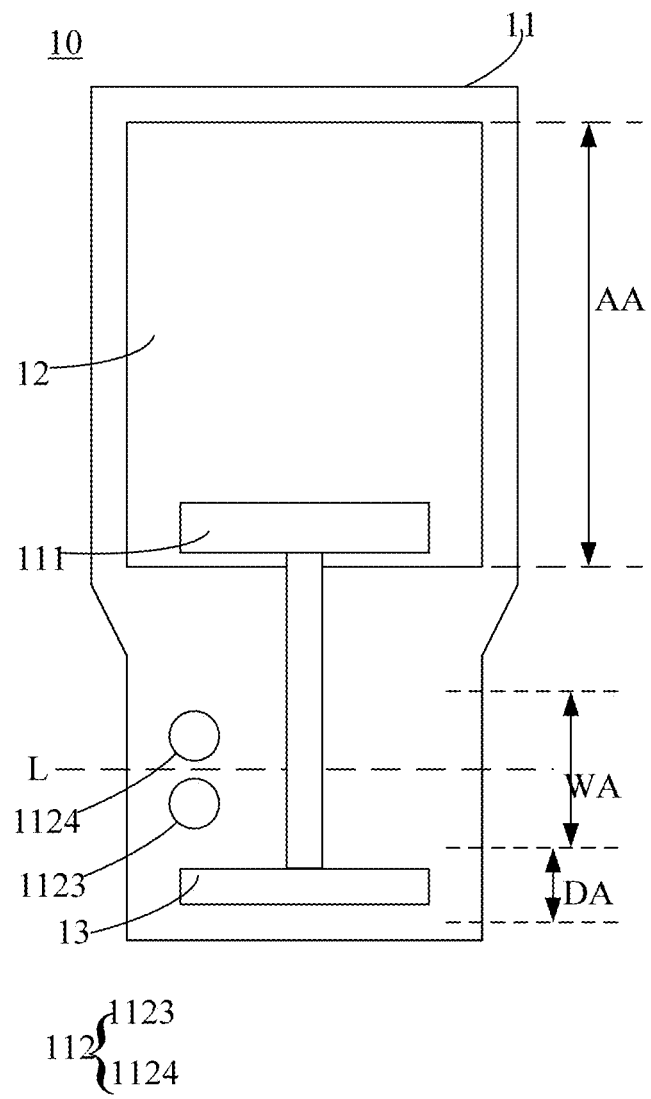
FIG. 3 is a third schematic structural diagram of a display panel according to an embodiment of the present disclosure.

In an embodiment of the present disclosure, as shown in FIG. 3, the through-hole 112 comprises a first sub-through-hole 1123 and a second sub-through-hole 1124, and the first sub-through-hole 1123 and the second sub-through-hole 1124 are symmetric about the bending center line L.

In an embodiment of the present disclosure, as shown in FIG. 3, a shape of the first sub-through-hole is circular.

In an embodiment of the present disclosure, the shape of the first sub-through-hole is rectangular.

In an embodiment of the present disclosure, the shape of the first sub-through-hole is regular polygonal.

Figure 4:
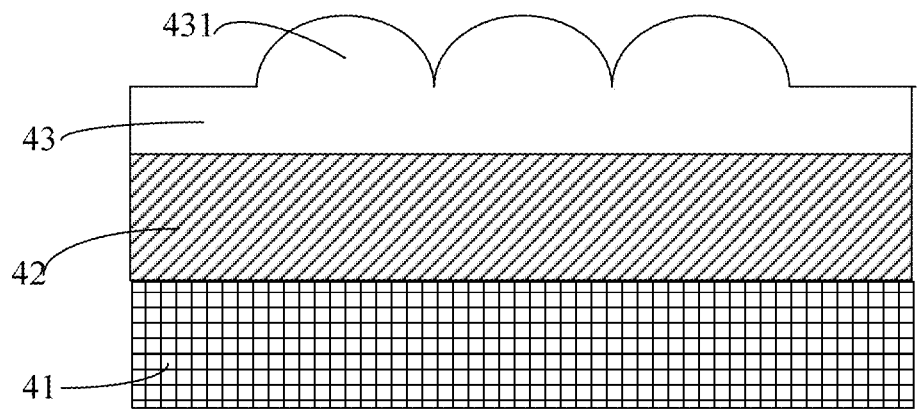
FIG. 4 is a fourth schematic structural diagram of a display panel according to an embodiment of the present disclosure.

In an embodiment of the present disclosure, as shown in FIG. 4, in the bending area WA, the display panel 10 comprises:

a flexible substrate layer 41;

a circuit layer 42 patterned to form the wirings 14;

a first organic layer 43, wherein the circuit layer 42 is disposed on the flexible substrate layer 41, and the first organic layer 43 is disposed on the circuit layer 42; and a plurality of first protruding parts 431 arranged on an upper surface of the first organic layer 43.

In an embodiment of the present disclosure, the first organic layer 43 is manufactured on the circuit layer 42 by spin coating or ink jet printing (IJP), a thickness of the first organic layer 43 ranges from 0.5 μm to 5 μm, and a material of the organic layer comprises, but is not limited to, acrylic resins, epoxy resins, or polycarbonate.

In an embodiment of the present disclosure, the plurality of first protruding parts 431 may be a long-strip shape. Specifically, a side projection of the plurality of first protruding parts 431 is a wavy shape, and an upper projection of the plurality of first protruding parts 431 is a long-strip shape which is parallel to a direction of the bending center line L.

In the embodiment of the present disclosure, when the bending area WA of the display panel is bent, especially when bent to 180 degrees, the bending area WA is subjected to a bending stress. The plurality of first protruding parts 431 have an effect of reducing the bending stress, thereby preventing bending cracks generated between film layers or within an interior of the film layers in the bending area WA and increasing service life of the display panel 10.

In an embodiment of the present disclosure, in the bending area WA, the display panel further comprises a second organic layer and a third organic layer. Wherein, the second organic layer is disposed on the first organic layer, a plurality of second protruding parts are arranged on an upper surface of the second organic layer, the third organic layer is disposed on the second organic layer, and a plurality of third protruding parts are arranged on an upper surface of the third organic layer.

In the embodiment, the plurality of second protruding parts and/or the plurality of third protruding parts may be formed by nanoimprint lithography. A side projection of the plurality of second protruding parts and/or the plurality of third protruding parts is a wavy shape, and an upper projection of the plurality of second protruding parts and/or the plurality of third protruding parts is a long-strip shape which is parallel to the direction of the bending center line L.

In the embodiment, because a number of the organic layers is increased and each organic layer has a plurality of protruding parts, the effect of reducing the bending stress can be further improved.

In the embodiment, a total thickness of the organic layers may be less than 5 μm, and the number of layers of the organic layers is not limited to 3.

As the bending stress is greater when closer to above the bending area WA, therefore, in an embodiment of the present disclosure, an elastic modulus of an organic layer which is closer to above the bending area WA is set to be greater, that is, an elastic modulus of the second organic layer is set to be greater than an elastic modulus of the first organic layer, and an elastic modulus of the third organic layer is set to be greater than the elastic modulus of the second organic layer, thereby further improving the effect of reducing the bending stress.

In an embodiment of the present disclosure, a density of the plurality of second protruding parts is greater than a density of the plurality of first protruding parts, and a density of the plurality of third protruding parts is greater than the density of the plurality of second protruding parts.

In the embodiment, the bending stress is greater when closer to above the bending area WA, so a density of protruding parts of an organic layer which is closer to above the bending area WA is set to be greater, thereby further improving the effect of reducing the bending stress.

In an embodiment of the present disclosure, in each organic layer of the embodiment, a density of a plurality of protruding parts which are closer to the bending center line L is greater than a density of the plurality of first protruding parts away from the bending center line L.

In an embodiment of the present disclosure, taking the third organic layer for example, a distance between two of the third protruding parts adjacent to the bending center line L is less than a distance between two of the third protruding parts away from the bending center line L. That is, a density of two first protruding parts adjacent to the bending center line L is greater than a density of two first protruding parts away from the bending center line L.

In the embodiment, the bending stress is greater when closer to a center of the bending area WA, so a density of protruding parts of an organic layer which is closer to the center of the bending area WA is set to be greater, thereby further improving the effect of reducing the bending stress.

In an embodiment of the present disclosure, a shape of an upper projection of the plurality of first protruding parts may be an oval, a square, a trapezoid, or a rhombus arrangement. The following takes square first protruding parts as an example for description. The first protruding parts are arranged on the first organic layer 43 in an array, and distances among the first protruding parts 431 are the same, that is, having the same density. The bending stress of the bending area is reduced by the array-distributed first protruding parts 431.

In the embodiment of the present disclosure, when the bending area of the display panel is bent, especially when bent to 180 degrees, the bending area is subjected to a bending stress. Disposing a plurality of protruding parts on the organic layers can produce the effect of reducing the bending stress, thereby preventing bending cracks generated between film layers or within an interior of the film layers in the bending area and increasing the service life of the display panel 10. Besides, because the stress is greater when closer to above the bending area or to the center of the bending area, the effect of reducing the bending stress can be further improved by increasing an elastic modulus of an organic layer closer to above the bending area, or increasing a density of the plurality of protruding parts adjacent to above the bending area or adjacent to the bending center line L.

Figure 5:
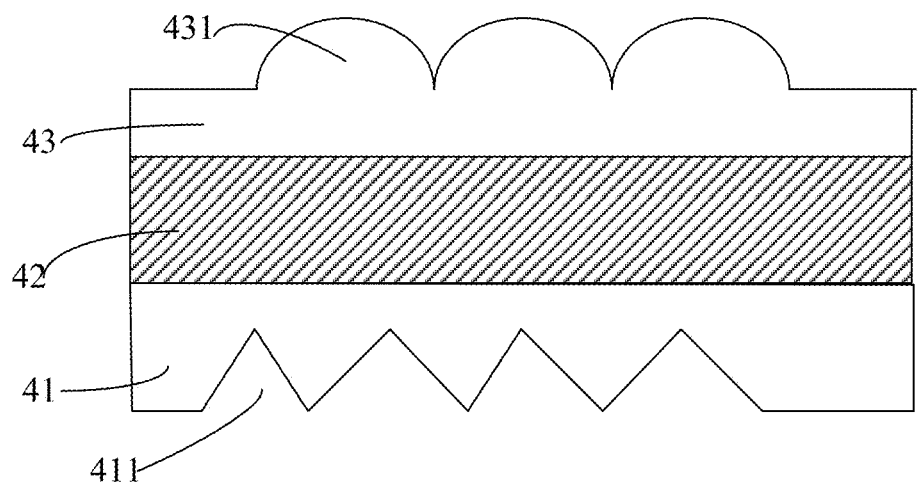
FIG. 5 is a fifth schematic structural diagram of a display panel according to an embodiment of the present disclosure.

In an embodiment of the present disclosure, as shown in FIG. 5, the flexible substrate layer 41 in the bending area WA is provided with strip-shaped channels 411 which are parallel to the bending center line L, and the strip-shaped channels 411 are arranged at intervals and parallel to each other to form a jagged structure which is recessed in the flexible substrate layer 41

In the embodiment, because the strip-shaped channels 411 are jagged and bottoms thereof are pointed, when the bending area is in a bent state, the strip-shaped channels 411 are in a closed state, and compressive and tensile stresses of the bending area WA are greatly reduced.

Figure 6:
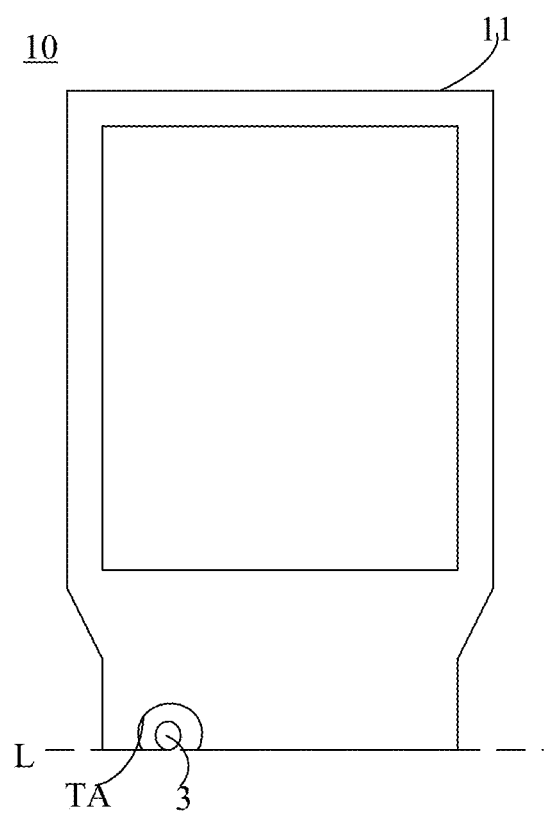
FIG. 6 is a schematic structural diagram of a display device according to an embodiment of the present disclosure.

In an embodiment of the present disclosure, as shown in FIG. 6, a display device provided by the embodiment of the present disclosure comprises:

the above display panel 10, comprising: the transistor array substrate including the plurality of array-distributed transistors, and the transistor array substrate is divided into the display area, the bending area, and the driving area; the light-emitting functional layer disposed in the display area of the transistor array substrate; the driving component disposed in the driving area of the transistor array substrate; and the plurality of wirings disposed in the bending area of the transistor array substrate and electrically connected to the transistors and the driving component; wherein the through-hole is defined in the bending area; and an electronic component 3 disposed under the display panel 10.

Wherein, a bonding area of the display panel 10 is bent under the display area through the bending area, the through-hole in the bending area forms a light transmitting area, and the light transmitting area is disposed on a light path of the electronic component 3.

In an embodiment of the present disclosure, the through-hole comprises a first sub-through-hole area and a second sub-through-hole area, and the first sub-through-hole area and the second sub-through-hole area are symmetric about the bending center line.

In an embodiment of the present disclosure, a shape of the first sub-through-hole area is fan-shaped.

In an embodiment of the present disclosure, the shape of the first sub-through-hole area is rectangular.

In an embodiment of the present disclosure, the shape of the first sub-through-hole area is trapezoidal.

In an embodiment of the present disclosure, the through-hole comprises a first sub-through-hole and a second sub-through-hole, and the first sub-through-hole and the second sub-through-hole are symmetric about the bending center line.

In an embodiment of the present disclosure, a shape of the first sub-through-hole is circular.

In an embodiment of the present disclosure, a shape of the first sub-through-hole is rectangular.

In an embodiment of the present disclosure, the shape of the first sub-through-hole is regular polygonal.

In an embodiment of the present disclosure, in the bending area, the display panel comprises:

a flexible substrate layer;

a circuit layer patterned to form the wirings;

a first organic layer, wherein the circuit layer is disposed on the flexible substrate layer, and the first organic layer is disposed on the circuit layer; and a plurality of first protruding parts arranged on an upper surface of the first organic layer.

It can be known according to the above embodiments:

the embodiment of the present disclosure provides a display panel and a display device. The display panel comprises a transistor array substrate divided into a display area, a bending area, and a driving area; a light-emitting functional layer disposed in the display area of the transistor array substrate; a driving component disposed in the driving area of the transistor array substrate; and a plurality of wirings disposed in the bending area of the transistor array substrate and electrically connected to transistors and the driving component. Wherein, a through-hole is defined in the bending area, after the bending area is bent along a bending center line, the through-hole forms a light transmitting area, and the light transmitting area is disposed on a light path of an electronic component. Based on the light transmitting area formed after bending the through-hole, the electronic component can be disposed under the display panel, which reduces a frame width without cutting the display area of the display panel to form a special-shaped area, thereby achieving a narrow frame design and solving the technical problem that current narrow frame technique needs to cut a display area of a display panel.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising:
    a transistor array substrate comprising a plurality of array-distributed transistors, wherein the transistor array substrate is divided into a display area, a bending area, and a driving area;
    a light-emitting functional layer disposed in the display area of the transistor array substrate;
    a driving component disposed in the driving area of the transistor array substrate; and
    a plurality of wirings disposed in the bending area of the transistor array substrate and electrically connected to the transistors and the driving component;
    wherein a through-hole is defined in the bending area, and after the bending area is bent along a bending center line, the through-hole forms a light transmitting area, and the light transmitting area is disposed on a light path of an electronic component; and
    wherein in the bending area, the display panel comprises:
    a flexible substrate layer;
    a circuit layer patterned to form the wirings;
    a first organic layer, wherein the circuit layer is disposed on the flexible substrate layer, and the first organic layer is disposed on one side of the circuit layer away from the flexible substrate layer; and
    a plurality of first protruding parts arranged on an upper surface of the first organic layer away from the flexible substrate layer.

2. The display panel according to claim 1, wherein the through-hole comprises a first sub-through-hole area and a second sub-through-hole area, and the first sub-through-hole area and the second sub-through-hole area are symmetric about the bending center line.

3. The display panel according to claim 2, wherein a shape of the first sub-through-hole area is fan-shaped.

4. The display panel according to claim 2, wherein a shape of the first sub-through-hole area is rectangular.

5. The display panel according to claim 2, wherein a shape of the first sub-through-hole area is trapezoidal.

6. The display panel according to claim 1, wherein the through-hole comprises a first sub-through-hole and a second sub-through-hole, and the first sub-through-hole and the second sub-through-hole are symmetric about the bending center line.

7. The display panel according to claim 6, wherein a shape of the first sub-through-hole is circular.

8. The display panel according to claim 6, wherein a shape of the first sub-through-hole is rectangular.

9. The display panel according to claim 6, wherein a shape of the first sub-through-hole is regular polygonal.

10. A display device, comprising:
    a display panel and an electronic component disposed under the display panel;
    wherein the display panel comprises:
    a transistor array substrate comprising a plurality of array-distributed transistors, wherein the transistor array substrate is divided into a display area, a bending area, and a driving area;
    a light-emitting functional layer disposed in the display area of the transistor array substrate;
    a driving component disposed in the driving area of the transistor array substrate; and
    a plurality of wirings disposed in the bending area of the transistor array substrate and electrically connected to the transistors and the driving component;
    wherein a through-hole is defined in the bending area;
    wherein a bonding area of the display panel is bent under the display area through the bending area, the through-hole in the bending area forms a light transmitting area, and the light transmitting area is disposed on a light path of the electronic component; and
    wherein in the bending area, the display panel comprises:
    a flexible substrate layer;
    a circuit layer patterned to form the wirings;
    a first organic layer, wherein the circuit layer is disposed on the flexible substrate layer, and the first organic layer is disposed on one side of the circuit layer away from the flexible substrate layer; and
    a plurality of first protruding parts arranged on an upper surface of the first organic layer away from the flexible substrate layer.

11. The display device according to claim 10, wherein the through-hole comprises a first sub-through-hole area and a second sub-through-hole area, and the first sub-through-hole area and the second sub-through-hole area are symmetric about the bending center line.

12. The display device according to claim 11, wherein a shape of the first sub-through-hole area is fan-shaped.

13. The display device according to claim 11, wherein a shape of the first sub-through-hole area is rectangular.

14. The display device according to claim 11, wherein a shape of the first sub-through-hole area is trapezoidal.

15. The display device according to claim 10, wherein the through-hole comprises a first sub-through-hole and a second sub-through-hole, and the first sub-through-hole and the second sub-through-hole are symmetric about the bending center line.

16. The display device according to claim 15, wherein a shape of the first sub-through-hole is circular.

17. The display device according to claim 15, wherein a shape of the first sub-through-hole is rectangular.

18. The display device according to claim 15, wherein a shape of the first sub-through-hole is regular polygonal.

* * * * *